Oct. 21, 1958 W. M. HANCOCK 2,856,998

ARTICLE FEEDING AND CONDITIONING APPARATUS

Filed May 24, 1956 5 Sheets-Sheet 1

INVENTOR
W. M. HANCOCK
BY [signature]
ATTORNEY

INVENTOR
W. M. HANCOCK
BY [signature]
ATTORNEY

Oct. 21, 1958 W. M. HANCOCK 2,856,998

ARTICLE FEEDING AND CONDITIONING APPARATUS

Filed May 24, 1956 5 Sheets-Sheet 3

INVENTOR
W. M. HANCOCK
BY W. A. Johnson
ATTORNEY

ARTICLE FEEDING AND CONDITIONING APPARATUS

Filed May 24, 1956 5 Sheets-Sheet 4

INVENTOR
W. M. HANCOCK
BY
W. A. Johnson
ATTORNEY

ARTICLE FEEDING AND CONDITIONING APPARATUS

Filed May 24, 1956 5 Sheets-Sheet 5

INVENTOR
W. M. HANCOCK
BY W.A. Johnson
ATTORNEY 2,856,998

ARTICLE FEEDING AND CONDITIONING APPARATUS

William M. Hancock, Groveland, Mass., assignor to Western Electric Company, Incorporated, New York, N. Y., a corporation of New York Application May 24, 1956, Serial No. 587,057

11 Claims. (Cl. 164—42)

This invention relates to article feeding and conditioning apparatus particularly apparatus for selecting and feeding singly a plurality of different electrical components to a mounting unit and conditioning the articles for mounting on a wiring board.

Wiring boards, that is, board-like panels formed of suitable dielectric material have electrical circuits printed thereon or otherwise applied to the surface thereof and provided with apertures for the leads of the electrical components, such as resistors or capacitors, for electrical connection in the circuits of the wiring board. The circuits for the wiring boards may vary in the number and different types of electrical components may be necessary for their completion. Due to the fact that the electrical components may vary in thickness, to assure firm mounting of the components on the wiring board with positive mechanical and electrical connections of their leads with the printed circuits thereof, it is necessary that the leads of the components vary in length to compensate for the variations in thicknesses of their respective components.

Applicant's co-pending application, Serial No. 573,005, filed March 21, 1956, discloses a mounting unit for forming the leads of the electrical components, inserting them in selected pairs of apertures in a wiring board and clinching the ends of the leads to secure their components against displacement and to place them electrically in chosen portions of the circuit.

The object of the present invention is an apparatus actuable through repeated cycles to singly feed articles of different characteristics to a mounting unit and mounting of the articles.

In one embodiment of the invention according to the object a transfer element is movable in a circular path through continuous cycles about a vertical axis relative to an arcuate arrangement of magazines for groups of different articles, the magazines having means actuable singly to eject an article from a selected magazine for each cycle of the element to be picked up by the element and transferred thereby to a mounting position.

More specifically, actuating means such as solenoids may be energized selectively one for each cycle of the transfer element to cause an article to drop from the selected magazine and to move into a receiving position where it is held by its leads in outlet members positioned below each magazine until removed therefrom by the transfer element and moved into alignment with the mounting unit.

Owing to the fact that the articles or electrical components in some instances vary in size, particularly in diameter or thickness, there must be variations in the lengths of their leads to assure accurate mounting of the articles firmly on one surface of the wiring board while their leads are of suitable length to be clinched into engagement with the opposing side of the wiring board and printed electrical conductors without overlapping or shorting other conductors of the wiring board. Therefore, when an article is selected automatically, electrically controlled means are energized (1) to eject the article from its hopper into a receiving position for the element and (2) sets of cutters are adjusted relative to each other, if necessary, to cause cutting of the leads of the article to predetermined lengths for mounting.

Other objects and advantages will be apparent from the following detailed description when considered in conjunction with the accompanying drawings, wherein.

Figure 1:
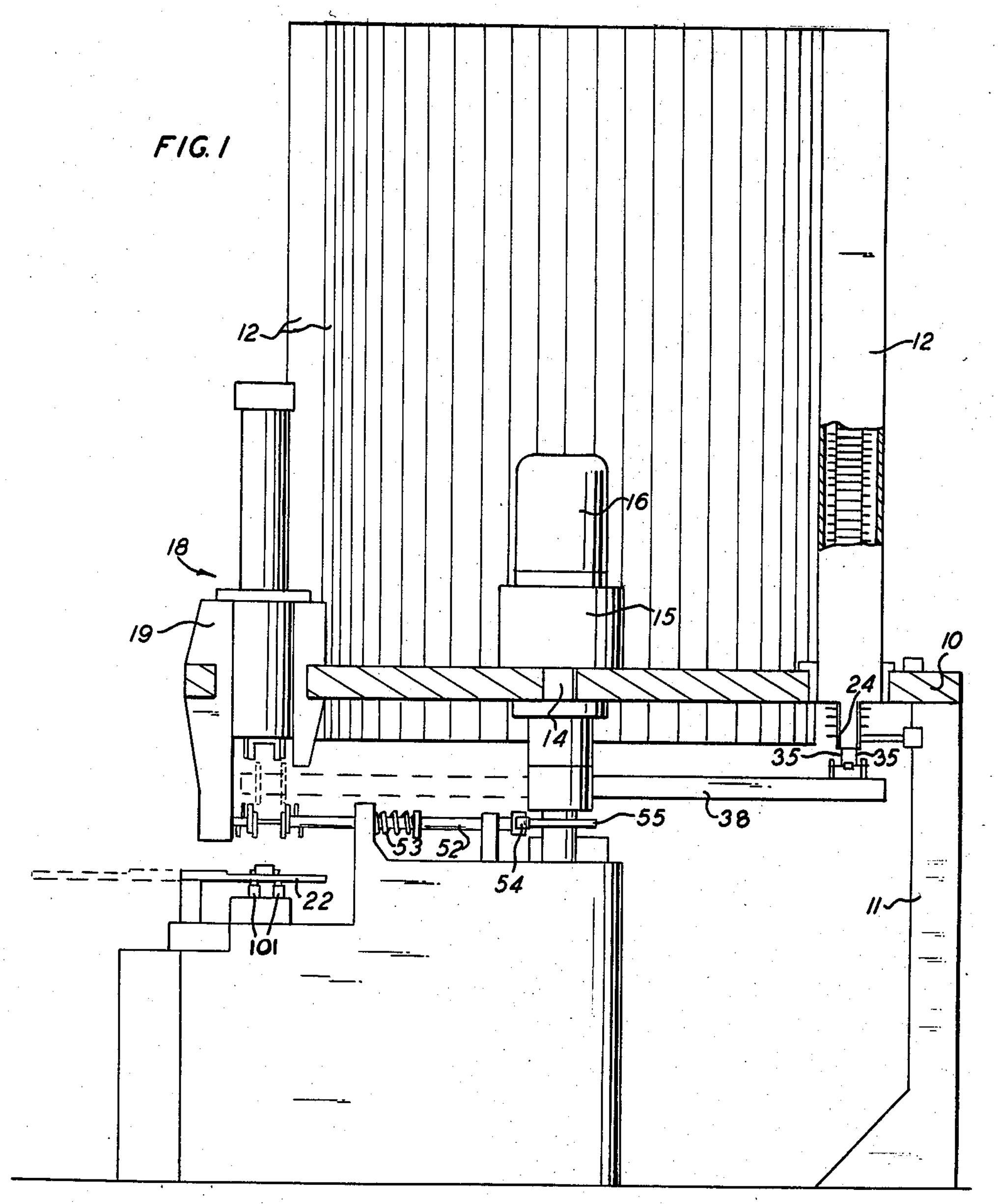
Fig. 1 is a vertical sectional view of the apparatus.
Figure 2:
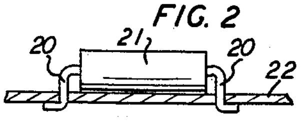
Fig. 2 is a fragmentary vertical sectional view of the wiring board with one of the articles mounted thereon.
Figure 3:
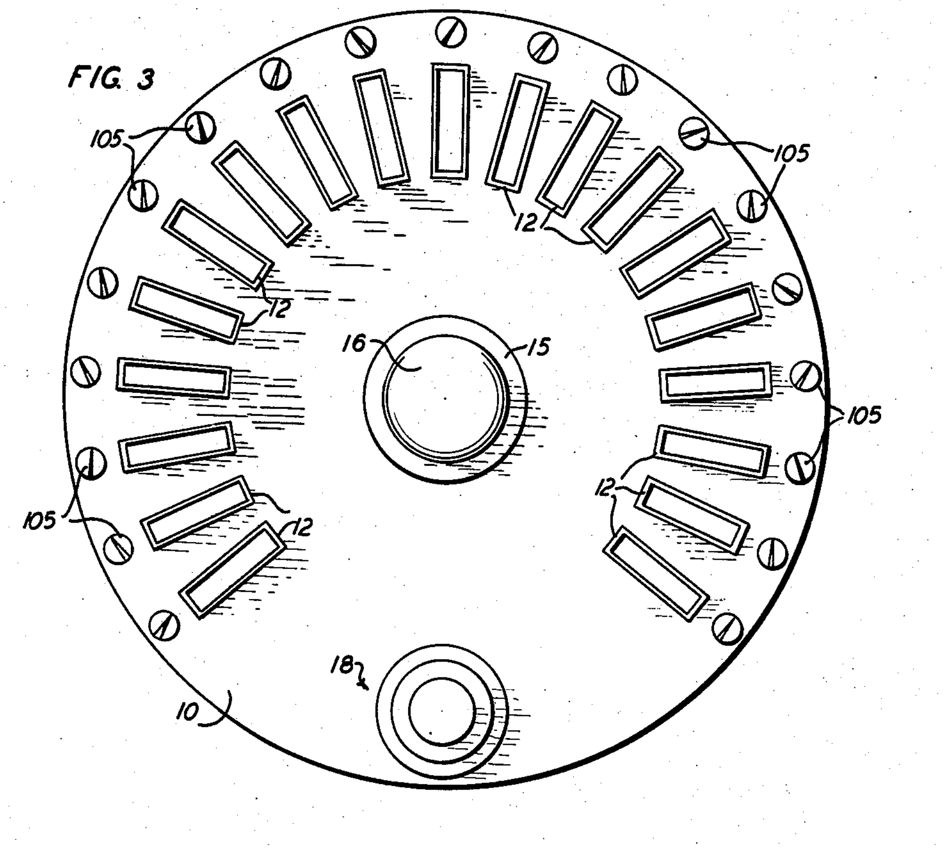
Fig. 3 is a top plan view of the apparatus.
Figure 4:
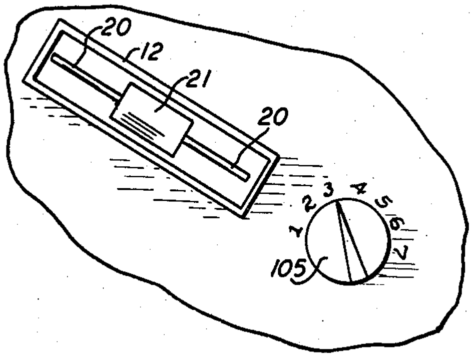
Fig. 4 is an enlarged fragmentary top plan view of one of the hoppers and its selector switch.

The apparatus as shown in Figs. 1 and 3 of the drawings includes a table 10 mounted on suitable supports and having an arcuate arrangement of hoppers 12 supported by the table and centered about a drive shaft 14. The drive shaft 14 is an output shaft of a speed reduction unit 15 mounted on the table 10 and driven by a motor 16.

A mounting unit 18 which is the subject matter of applicant's aforementioned co-pending application is supported at 19 by the table 10 at what might be defined the mounting position of the apparatus. The unit 18 is adapted, during its downward movement, to form substantially right-angle bends in the leads 20 of any of the articles or components 21 shown in Figs. 4, 5, 6 and 7, after they have been cut to predetermined lengths, and mounting them in selected pairs of apertures of a wiring board 22.

Figures 5, 6, 7:
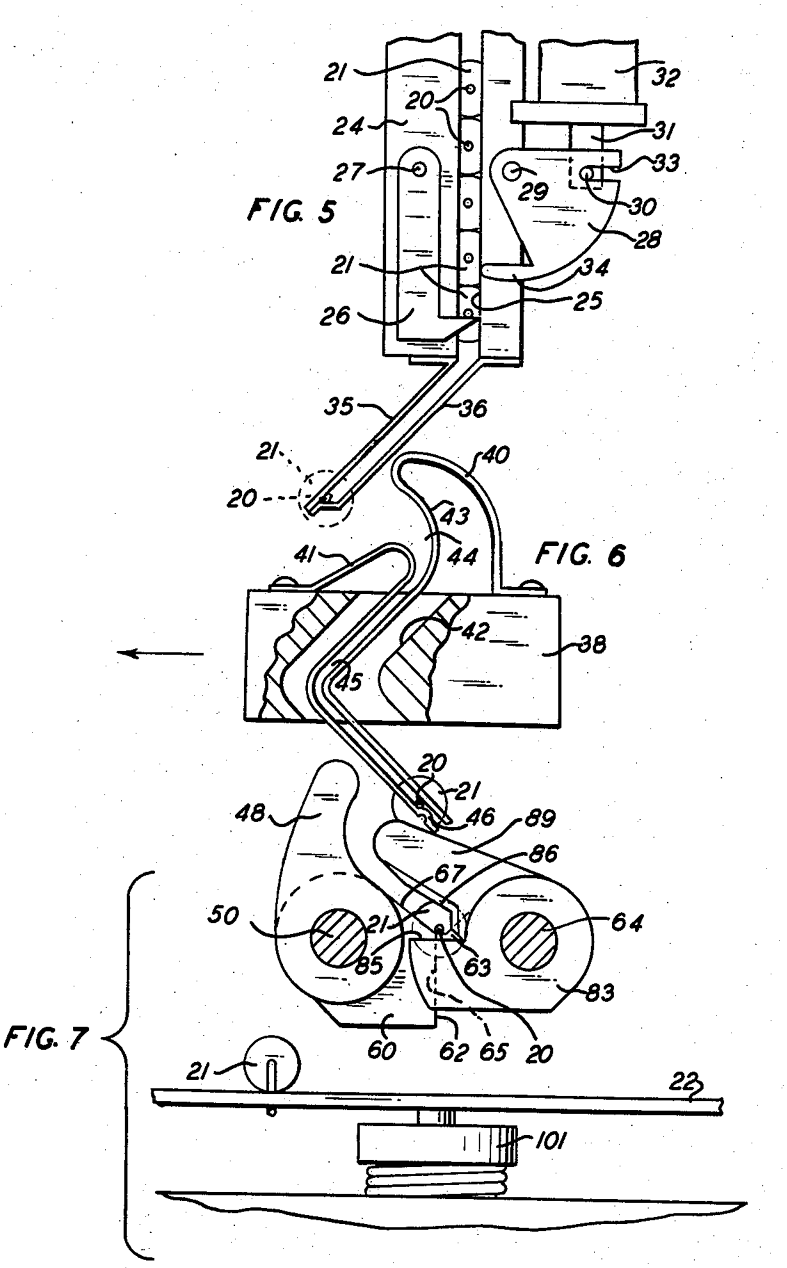
Fig. 5 is an enlarged side elevational view of the lower portion of one of the hoppers and the ejecting means therefor.
Fig. 6 is an enlarged elevational view of the transfer element.
Fig. 7 is an end elevational view of a portion of the apparatus in the cutting and mounting area thereof.

The hoppers 12 are rectangular in cross-section to completely house their respective groups of articles or components with the exception of the lower portions of the hoppers beneath the table which are reduced in size as indicated at 24 to more accurately locate the articles and provide slots 25 in opposing sides thereof through which the leads 20 of the components may extend. Each reduced portion 24 of the hoppers is provided with retaining members 26 in the form of L-shaped levers disposed upon each side of each reduced portion 24 and pivotally supported at 27. The lower ends of the pairs of members 26 extend beneath the leads of the lowermost components 21 to hold the components against escapement from the hoppers. Ejecting members 28 of the contour shown in Fig. 5 are disposed upon each side of each reduced portion 24 of each hopper 12, pivotally supported at 29 and operatively connected to a pin 30 of a core 31 of a solenoid 32 through a slot 33. Integral fingers 34 of the members 28 are positioned normally out of the path of the leads 20 of the components 21 and are adapted upon actuation of the members 28, through energization of their solenoids 32, to move beneath the leads of the next to the lowest component, engage and actuate the members 26 free of the leads of the lowermost component to thereby free the lowermost component to drop from the hopper. The fingers 34 of the members 28 will allow the members 26 to return to their normal positions to support the articles in the hoppers when their solenoids are de-energized. Each hopper has spaced pairs of receiving members 35 and 36 of the contours shown in Fig. 5 mounted on the lower ends of their respective reduced portions 24 to receive the leads of the ejected component 21 and hold them in a given position.

A transfer element 38 is in the form of an arm fixedly mounted on the shaft 14 and having means disposed adjacent its outer end to receive the ejected components from any of the hoppers, or their receiving members 35 and 36, and transfer them to the mounting position in general alignment with the mounting unit 18. This means in the present embodiment of the invention includes spaced pairs of resilient members 40 and 41 of the contours shown in Fig. 6 and positioned to move on the outside of the pairs of receiving members 35 and 36. These members extend through a passageway 42 in the arm 38 which is of sufficient size for the selected component 21 to drop therethrough while the leads are guided by the pairs of members 40—41. Fig. 6 has been placed sufficiently close to Fig. 5 to illustrate the relative positions of the structures shown in these figures when the arm is about to remove an ejected component from the receiving members of its hopper. The like contours of the members 40 are such that the curved portions 43 will engage the leads 20 of the ejected component, temporarily held by the receiving members 35 and 36, to force the leads of the component free of these resilient members and allow the component to drop to the position shown in solid lines in Fig. 6. The contours of the members 41 are as shown in Fig. 6 to provide a wide opening 44, between the adjacent portions of the members 40—41 in each pair of members, and a restricted path 45 for each lead to the lower position where a bent portion 46 of each member 41 will hold its respective lead 20 of the ejected component 21 until the transfer arm 38 moves through the mounting position.

Figure 8:
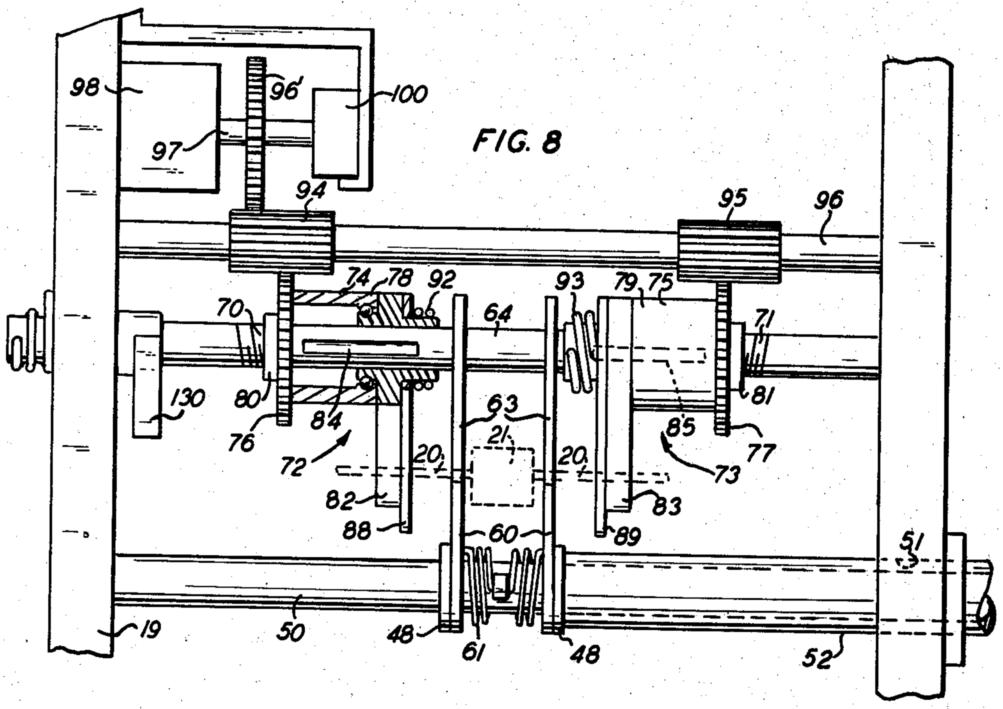
Fig. 8 is a top plan view of the receiving and cutting mechanism of the apparatus.
Figure 9:
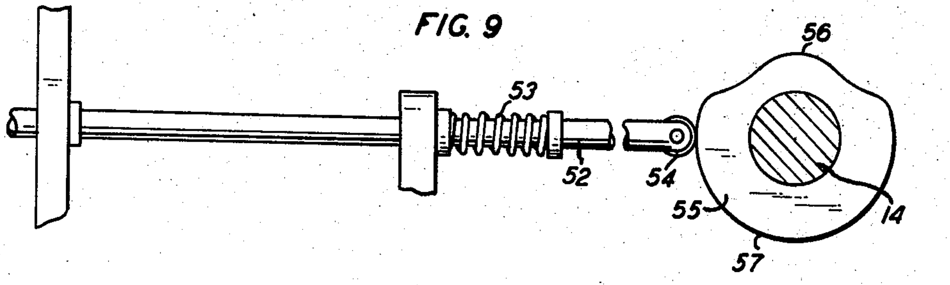
Fig. 9 is a continuation to the right of the structure shown in Fig. 8.

The structure shown in Fig. 7 is shown closely adjacent the structure of Fig. 6 to illustrate the relative positions of these structures when the transfer arm 38 is closely adjacent the mounting position. In the mounting position, attention being directed to Figs. 6, 7, 8 and 9, there are spaced members 48, of the general contours shown in Fig. 7, positioned to engage the leads 20 at each end of the component 21 and to thereby eject the component from the members 40 and 41 of the transfer arm. In reality, the component 21 will be held against movement by the members 48 engaging the leads 20 until continued movement of the transfer arm 38 moves beyond the mounting position freeing the component to drop to the position shown in solid lines in Fig. 7. One of the members 48 is fixedly mounted on a rod 50 having one end mounted in a portion of the support 19 and extending through an aperture 51 in another portion of the support. The other member 48, which is the member at the right in Fig. 8, is fixed to the adjacent end of a push rod 52 which is hollow for a portion of its length to receive the rod 50. The push rod 52 is normally urged outwardly by a spring 53 so that a roller 54 mounted rotatably in a bifurcated end thereof will ride upon a cam 55. The cam 55 is mounted on the drive shaft 14 as shown in Figs. 1 and 9, and has a low portion 56 and a high portion 57.

Guiding members 60 are mounted freely on the rod 50 adjacent the inner surfaces of their respective members 48 where they are held in the normal positions shown in Figs. 7 and 8, by suitable spring means 61. A locating or stop means for the members 60 are not shown but they may constitute any suitable means to allow rocking movement of the members 60 downwardly looking from the top of Fig. 8 or counterclockwise looking from the left end of Fig. 8, the stop means limiting the return movement of the members, by the spring means 61, to the positions shown in this figure.

The guiding members 60 have their outer ends 62 (Fig. 7) disposed in abutting engagement with the adjacent ends of holding or supporting members 63 which are fixed to a shaft 64. The adjacent or abutting ends of the supporting members 63 are identified in Fig. 7 at 65. The members 60, as shown in Fig. 7, have downwardly slanting surfaces 67 on which the leads 20 of the successive articles or components 21 ride downwardly and come to rest upon the adjacent horizontal surfaces of the holders 63.

The shaft 64 is provided with two threaded portions 70 and 71, there being right hand threads in the portion 70 and left hand threads in the portion 71. Cutting units indicated generally at 72 and 73 are mounted on the threaded portions 70 and 71 respectively of the shaft 64. These units include tubular members 74 and 75 interposed between gears 76—77 and the outer races of bearings 78—79 respectively and fixed thereto. The inner races of the bearings 78 and 79 are mounted on unthreaded portions of the shaft 64 for sliding movement. The gears 76 and 77 have internally threaded members 80 and 81 mounted on their outer surfaces to interengage the threads 70 and 71 respectively to cause lateral movements of the cutting units 72 and 73 like distances toward or away from each other during rotations of their gears 76 and 77 in one direction or the other. Lower cutting members 82 and 83, fixed to or formed integral with their inner races of bearings 78 and 79, are mounted for axial movement therewith on unthreaded portions of the shaft 64 but are provided with keys (not shown) disposed in keyways 84 and 85 of the shaft to allow axial movements thereof. The lower cutting members 82 and 83 are of the general contour shown in Fig. 7, providing cutting edges 85 to cooperate with cutting edges 86 of upper cutting members 88 and 89. The upper cutting members 88 and 89 are rotatably mounted on hub-like portions of the lower cutting members 82 and 83, moved axially of the shaft 64 therewith and held in open positions, as shown in Fig. 7, by springs 92 and 93. The open positions of the upper cutting members are under the control of suitable stop means not shown.

The gears 76 and 77 of the cutting units 72 and 73 interengage pinions 94 and 95 mounted fixedly on a shaft 96 which has its ends journalled in suitable bearings in members of the support 19. A gear 96′ interengaging the pinion 94 is mounted on a shaft 97 of a servo-motor 98. Furthermore, a brush arm 99 (Fig. 10) of a potentiometer 100 (Figs. 8 and 10) is mounted on the end of the shaft 97.

Figure 10:
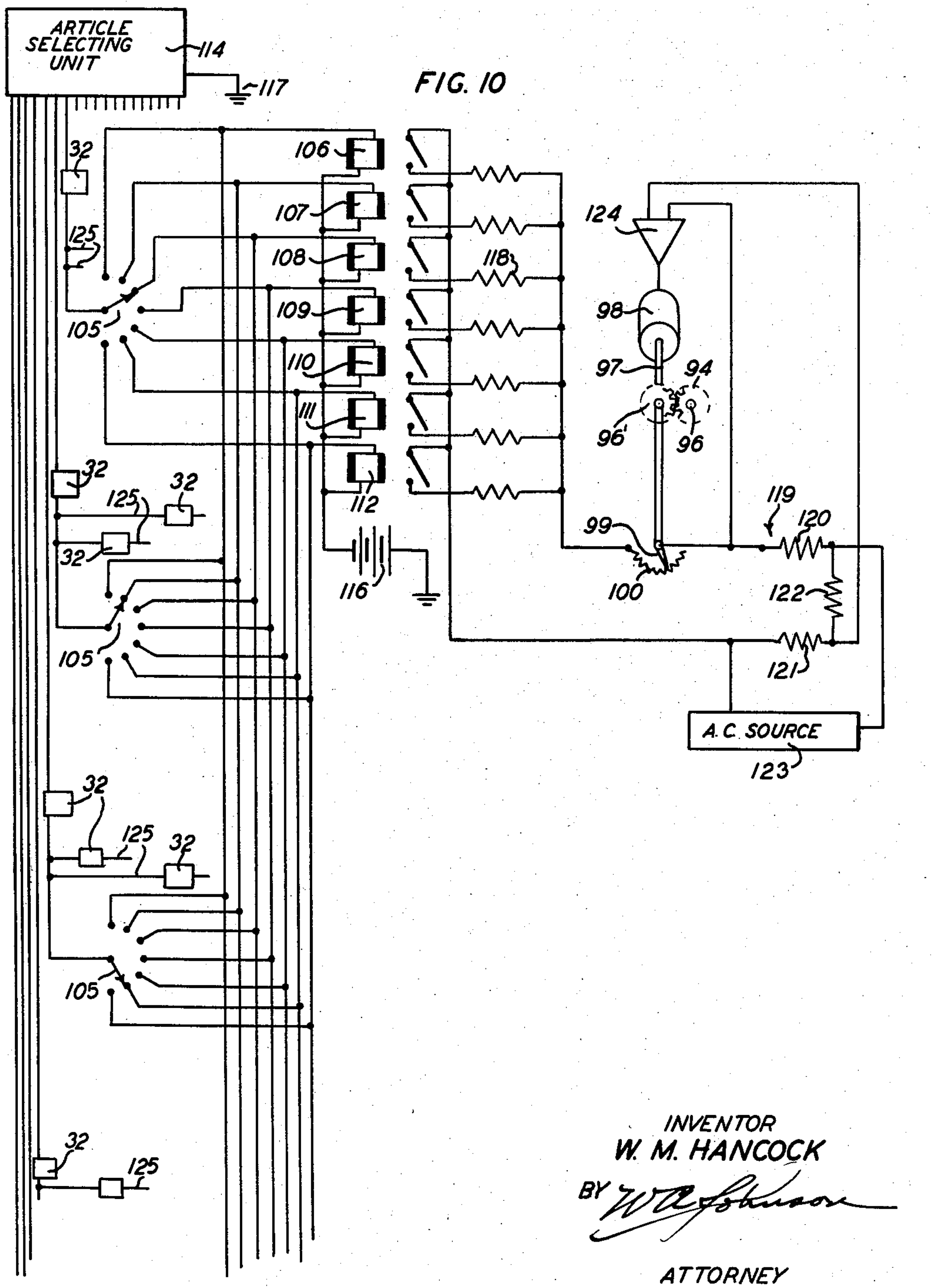
Fig. 10 is a schematic illustration of the electrical controls for the apparatus.

Attention is now directed to the electrical control means for the apparatus as shown in Fig. 10. In the present embodiment of the invention nineteen hoppers are shown in Fig. 3 for the different electrical components which may be mounted in select apertures of the wiring board 22 through the aid of clinching units 101, which is the subject matter of applicant's co-pending application and which are adapted to receive the ends of the formed leads of the components or articles and clinch them firmly against the underside of the wiring board 22 to mechanically connect the articles or components in place and to electrically connect their leads in preferred circuits of the wiring board. There may be any desired number of hoppers depending upon the different types of components to be mounted in circuits. All of the components in the different hoppers may vary, not only in their electrical characteristics but in their physical structures, but as the critical dimension in the mounting of these articles on a wiring board lies in their diameters, thicknesses and particularly the distance between the normal planes of the leads thereof and the surface of each article engaging or resting upon the wiring board, it is the comparison of these dimensions in the various articles which must be considered. Therefore, let it be assumed that the nineteen different electrical components or articles fall within seven groups regarding the critical dimension namely, the distance between the centers of the leads and the surfaces to rest upon the wiring board.

To carry out this illustration, each hopper is provided with a selector switch 105 movable to any one of seven positions depending upon the group in which the articles of their respective hoppers are included. The selector switches, three of which are shown in Fig. 10, are provided with seven contacts respectively connected to relays 106, 107, 108, 109, 110, 111 and 112. A commercially known unit 114 identified in the present instance as an article selecting unit, controlled by preselected perforated cards or perforated tapes for the different wiring boards 22 to be provided with a predetermined group of the components from the hoppers, will operate to close any of the nineteen circuits successively in timed relation with the cycles of the transfer arm 38, including the solenoids 32 for the respective hoppers chosen and the selector switches for the particular hoppers. Considering, for example, the hopper shown in Fig. 4 with its selector switch disposed at position 3, the same as in the upper portion of Fig. 10, a circuit completed by the article selecting unit 114 for this particular hopper will allow electrical energy to pass from grounded battery 116 through relay 108, selector switch 105, the solenoid 32 for this respective hopper, through the closed contacts of the article selecting unit, to ground 117. When relay 108 is energized its contact is closed to introduce a resistance 118 of a known value in one arm of a bridge circuit indicated generally at 119. The bridge circuit 119 is composed of resistances 120 and 121 in opposing arms thereof and a resistance 122 of a known value in the intermediate arm thereof. A source of electrical energy 123 is provided for the bridge circuit. The potentiometer 100 is included in the arm of the bridge circuit with the resistance 118 and, through the connections of a servo-amplifier 124, any unbalancing of the bridge through the insertion of the resistance 118 with the potentiometer 100 will cause driving of the servomotor 98 in one direction or the other to vary the potentiometer until the bridge is balanced and cause rotation of the shaft 96 to cause its pinions 94 and 95 to rotate their gears 96' and 97 to bring about adjustment of the cutting units 72 and 73 like distances toward or away from each other to position them for cutting of the leads of the component received from the chosen hopper to predetermined lengths.

It is not possible to show the complete arrangements of electrical circuits for the apparatus on one sheet of drawing, but it is believed that the complete understanding of the electrical circuits may be determined through the illustration in Fig. 10. For example, the additional lines leading from the article selecting unit 114 represents the individual circuits for the hoppers and their operating solenoids 32. Certain of these lines may be brought into and connected to other lines in advance of their respective selector switches 105 as indicated by reference numerals 125 to represent the dividing of the nineteen main circuits into seven different groups of articles disposed in the hopper making it possible to individually select the articles or components and to bring about adjustments of the cutting units when adjustments are necessary. When successive articles having like critical dimensions are fed to the mounting position there are no adjustments of the cutting units for the reason that the bridge circuit would remain balanced bringing about no operation of the servo-motor 98. It is only when one of the circuits from the unit 114 goes through different selector switches 105 for a component with a different critical measurement. This results in the energization of one of the other relays 106 to 112 inclusive to introduce one of the other resistances in the arm of the bridge circuit with the potentiometer 100. This unbalances the bridge circuit again to drive the servomotor 98 to bring about adjustment of the potentiometer 99—100 to balance the bridge circuit and in this manner bring about adjustment of the cutting units.

During the operation of the apparatus let it be assumed that the hoppers are filled with their respective articles or electrical components and that the selector switches 105 are set accurately according to the sizes or measurements of the components in their respective hoppers. The motor 16 is energized to bring about operating cycles of the shaft 14 including the transfer arm 38 and the cam 55. The cycles of operation of the arm and cam are in synchronism with the operating functions of the article selecting unit 114 so that during each operating cycle of the arm the next article selected by the unit 114 has been dropped from its hopper through actuation of the mechanism shown in Fig. 5 resulting from the energization of its solenoid 32, to position the article in the retaining members 35—36 as shown in dotted lines (Fig. 5) ready to be received by the transfer arm 38 (Fig. 6). The members 40 and 41 of the transfer arm 38 remove the selected article allowing it to drop through the aperture 42 of the arm and rest in the position shown in solid lines in Fig. 6. Upon reach reaching the mounting position, combining Figs. 6 and 7, the leads 20 of the selected component will engage the members 48, be removed from the resilient members 40 and 41 of the tranfer arm thereby, and allowed to drop to the position shown in Fig. 7. Here the leads of the component will rest upon the horizontal surfaces of the holders 63 and, while in this position, the member 60 carried by the push rod 52, will be moved laterally through the action of the high portion 57 of the cam 55 against the force of spring 53 to adjust the component to center it between the members 60 and 63. At this time, the mounting unit 18 is operated as disclosed in applicant's aforementioned application to move downwardly on the upper cutting members 88 and 89, after releasing a latch (not shown) for the shaft 96, to move them relative to the cutting members 82 and 83 and at the same time move the members 63 about the axis of the shaft 64 to allow the cutting edges 85 and 86 to function in cutting the leads 20 of the component to desired lengths. The unit 18 continues its downward movement, rocking the cutters with the shaft 96 and the holders 63 out of its path after substantially right-angle bends are formed in the component leads, to move them through apertures in the wiring board 22 where their leading ends will be clinched by the units 101 and the component held against the opposing surface of the board.

The operating cycle continues and during the selection of each component a circuit is completed initially in the article selecting unit 114 through the solenoid 32 of the selected hopper and the chosen selector switch 105 for that hopper to introduce a resistance associated with any one of the relays 106 to 112, such as resistance 118 for relay 108, in the arm of the bridge with the potentiometer 100 to either continue to balance the bridge and cause the servo-motor 98 to remain idle, or to unbalance the bridge and bring about driving of the servo-motor a predetermined distance in one direction or the other to balance the bridge and in doing so, bring about adjustment of the cutting units to cut the leads of the chosen to predetermined lengths.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. An apparatus for selectively feeding singly a plurality of different articles, having aligned leads extending from opposite sides thereof, to a unit, the apparatus comprising a feeding element, means to support the feeding element for continuous cycles of movement, means to move the element continuously in a circular path in which the unit is mounted, a magazine for each group of the different articles, outlet members for each magazine positioned to support their articles singly in the path where they will be removed by the element and fed to the unit, and a releasing means for each magazine actuable singly during each cycle of the element to cause an article to drop from one of the magazines and be held in the path by the outlet members thereof.

2. An apparatus for selectively feeding singly a plurality of different articles, having aligned leads extending from opposite sides thereof, to a unit, the apparatus comprising a feeding element, means to support the feeding element for continuous cycles of movement, means to move the element continuously in a circular path in which the unit is mounted, and means actuable to position successively predetermined articles in the path during each cycle of the element for movement thereof by the element to the unit.

3. An apparatus for selectively feeding singly a plurality of articles differing in characteristics except like leads extending from opposite sides thereof, the apparatus comprising an element movable in a circular path, means to move the element through continuous cycles about a vertical axis, magazines, for receiving groups of the different articles in stacked formation and having slots for the leads to extend through, supported in circular arrangement about the axis and above the path, means disposed adjacent exit ends of each magazine and actuable singly to eject articles successively from selected magazines, one for each cycle of the element, and means for each magazine to receive each article ejected therefrom and hold it in the path for removal by the element.

4. An apparatus for selectively feeding singly a plurality of articles differing in characteristics except like leads extending from opposite sides thereof, the apparatus comprising an element movable in a circular path, means to move the element through continuous cycles about a vertical axis, magazines, for receiving groups of the different articles in stacked formation and having slots for the leads to extend through, supported in circular arrangement about the axis and above the path, means disposed adjacent exit ends of each magazine and actuable singly to eject articles successively from selected magazines, one for each cycle of the element, and pairs of members disposed adjacent exit ends of each magazine cooperating to guide the leads of each article to the path for the element.

5. An apparatus for selectively feeding singly a plurality of articles differing in characteristics except like leads extending from opposite sides thereof, the apparatus comprising an element movable in a circular path, means to move the element through continuous cycles about a vertical axis, magazines, for receiving groups of the different articles in stacked formation and having slots for the leads to extend through, supported in circular arrangement about the axis and above the path, means disposed adjacent exit ends of each magazine and actuable singly to eject articles successively from selected magazines, one for each cycle of the element, and pairs of members disposed adjacent exit ends of each magazine cooperating to guide the leads of each article to the path for the element, one of the members of each pair having shelf portion to support its lead of each ejected article and locate each article and its leads in the path.

6. An apparatus for selectively feeding singly a plurality of articles differing in characteristics except like leads extending from opposite sides thereof, the apparatus comprising an element movable in a circular path, means to move the element through continuous cycles about a vertical axis, magazines, for receiving groups of the different articles in stacked formation and having slots for the leads to extend through, supported in circular arrangement about the axis and above the path, means disposed adjacent exit ends of each magazine and actuable singly to eject articles successively from selected magazines, one for each cycle of the element, and pairs of members disposed adjacent exit ends of each magazine cooperating to guide the leads of each article to the path for the element, one of the members of each pair having shelf portion to support its lead of each ejected article and locate each article and its leads in the path, the other members being resilient to temporarily hold the adjacent leads on the shelf and release the leads when removed from the shelves by the element.

7. In an apparatus for selectively feeding articles of different thicknesses with leads extending from opposite sides thereof, to a mounting unit hoppers for groups of the different articles, an article selecting unit actuable to close predetermined electrical circuits successively for the hoppers, and means operable by the successive closing of the circuits to release articles singly from the selected hoppers.

8. In an apparatus for selectively feeding articles of different thicknesses with leads extending from opposite sides thereof, to a mounting unit hoppers for groups of the different articles, an article selecting unit actuable to close predetermined electrical circuits successively for the hoppers, means operable by the successive closing of the circuits to release articles singly from the selected hoppers, and a transfer element movable through repeated cycles to receive the released articles from the hoppers and transfer them singly to the mounting unit.

9. In an apparatus for selectively feeding articles of different thicknesses with leads extending from opposite sides thereof, to a mounting unit hoppers for groups of the different articles, an article selecting unit actuable to close predetermined electrical circuits successively for the hoppers, means operable by the successive closing of the circuits to release articles singly from the selected hoppers, a transfer element movable through repeated cycles to receive the released articles from the hoppers and transfer them singly toward the mounting unit, disposed adjacent the mounting unit to receive the leads and actuable to cut the leads of successive articles to predetermined lengths, and means to support the cutters for adjustment relative to each other and the mounting unit.

10. In an apparatus for selectively feeding articles of different thicknesses with leads extending from opposite sides thereof, to a mounting unit hoppers for groups of the different articles, an article selecting unit actuable to close predetermined electrical circuits successively for the hoppers, means operable by the successive closing of the circuits to release articles singly from the selected hoppers, a transfer element movable through repeated cycles to receive the released articles from the hoppers and transfer them singly to the mounting unit, cutters disposed adjacent the mounting unit to receive the leads and actuable to cut the leads of successive articles to predetermined lengths, means to support the cutters for adjustment relative to each other and the mounting unit, and means responsive to the closing of the circuits singly to adjust the cutters relative to each other for the leads of the articles of different thicknesses.

11. In an apparatus for selectively feeding articles of different thicknesses with leads extending from opposite sides thereof, to a mounting unit hoppers for groups of the different articles, an article selecting unit actuable to close predetermined electrical circuits successively for the hoppers, means operable by the successive closing of the circuits to release articles singly from the selected hoppers, a transfer element movable through repeated cycles to receive the released articles from the hoppers and transfer them singly to the mounting unit, cutters disposed adjacent the mounting unit to receive the leads and actuable to cut the leads of successive articles to predetermined lengths, means to support the cutters for adjustment relative to each other and the mounting unit, and adjustable electrical control units for the circuits of each hopper to cause adjustment of the cutters predetermined distances relative to each other to cause the leads of the successive articles to be cut to predetermined lengths.

References Cited in the file of this patent

UNITED STATES PATENTS

| | | |
|---|---|---|
| 1,044,591 | Stocker | Nov. 19, 1912 |
| 1,705,936 | Massie | Mar. 19, 1929 |

OTHER REFERENCES

Final Report, "Mechanized Production of Miniature Electronic Packaged Subassemblies Using Modular Construction," Melpar, Inc., Alexandria, Va., Feb. 23, 1953, pages 34–39.

WADC Technical Report 55–230, "Development and Application of Automatic Assembly Techniques for Miniaturized Electronic Equipment," Stanford Research Institute, Stanford University, May 1955, pages 172–187.